(12) United States Patent
Tsinker

(10) Patent No.: US 6,850,181 B1
(45) Date of Patent: Feb. 1, 2005

(54) APPARATUS AND METHOD FOR NOISE REDUCTION FOR A SUCCESSIVE APPROXIMATION ANALOG-TO-DIGITAL CONVERTER CIRCUIT

(75) Inventor: Vadim Tsinker, Belmont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/755,013

(22) Filed: Jan. 8, 2004

(51) Int. Cl.[7] ............................................. H03M 1/34
(52) U.S. Cl. ................................... 341/163; 341/155
(58) Field of Search .............................. 341/163, 155, 341/118, 120

(56) References Cited

U.S. PATENT DOCUMENTS

| | | | | |
|---|---|---|---|---|
| 5,831,562 A | * | 11/1998 | Van Auken et al. | ........ 341/122 |
| 5,889,486 A | | 3/1999 | Opris et al. | ................. 341/150 |
| 6,008,749 A | * | 12/1999 | Smith | .......................... 341/163 |
| 6,144,331 A | * | 11/2000 | Jiang | ........................... 341/172 |
| 6,587,066 B1 | * | 7/2003 | Somayajula | ................. 341/172 |
| 6,667,707 B2 | * | 12/2003 | Mueck et al. | ................ 341/172 |
| 2003/0174083 A1 | * | 9/2003 | Mayfield | ..................... 341/166 |

* cited by examiner

Primary Examiner—Peguy JeanPierre
(74) Attorney, Agent, or Firm—Darby & Darby P.C.; Mathew M. Gaffney

(57) ABSTRACT

An apparatus and method for noise reduction in a successive approximation (SA) analog-to-digital converter (ADC) is provided. The SA ADC includes a noise-compensating comparator circuit, an SA logic circuit, and a DAC circuit. A first reference signal is generated such that the first reference signal has a noise component that is substantially similar to a noise component of a first comparison signal. The noise-compensated comparator circuit is configured to provide a differential signal. The first comparison signal is included in a first half of the differential signal, and the first reference signal is included in a second half of the differential signal, such that the noise component of the first comparison signal is substantially cancelled out differentially. The noise-compensating comparator circuit is further configured to compare the two halves of the differential signal to provide a comparator output signal.

20 Claims, 16 Drawing Sheets

APPARATUS AND METHOD FOR NOISE REDUCTION FOR A SUCCESSIVE APPROXIMATION ANALOG-TO-DIGITAL CONVERTER CIRCUIT

FIELD OF THE INVENTION

The invention is related to noise reduction, and in particular, to an apparatus and method for noise reduction in a successive approximation analog-to-digital converter circuit.

BACKGROUND OF THE INVENTION

There are several different types of analog-to-digital converter (ADC) circuits. One type of ADC circuit is a successive approximation (SA) ADC. A successive approximation ADC tests multiple digital output codes. Typically, the analog input voltage is sampled. Then, the most significant bit of the digital output code is set initially to one, and the remaining bits are initially set to zero. Next, the digital output code is tested. If the digital output code is too low, the most significant bit is left at one. Alternatively, if the digital output code is too high, the bit is changed to zero. Then, the second most significant bit is changed to one. The digital output code is tested again. If the digital output code is too low, the second most significant bit is left at one. Alternatively, if the digital output code is too high, the second most significant bit is changed back to zero. The process is repeated until all of the bits have been tested.

BRIEF DESCRIPTION OF THE DRAWINGS

Non-limiting and non-exhaustive embodiments of the present invention are described with reference to the following drawings, in which.

DETAILED DESCRIPTION

Figure 1:
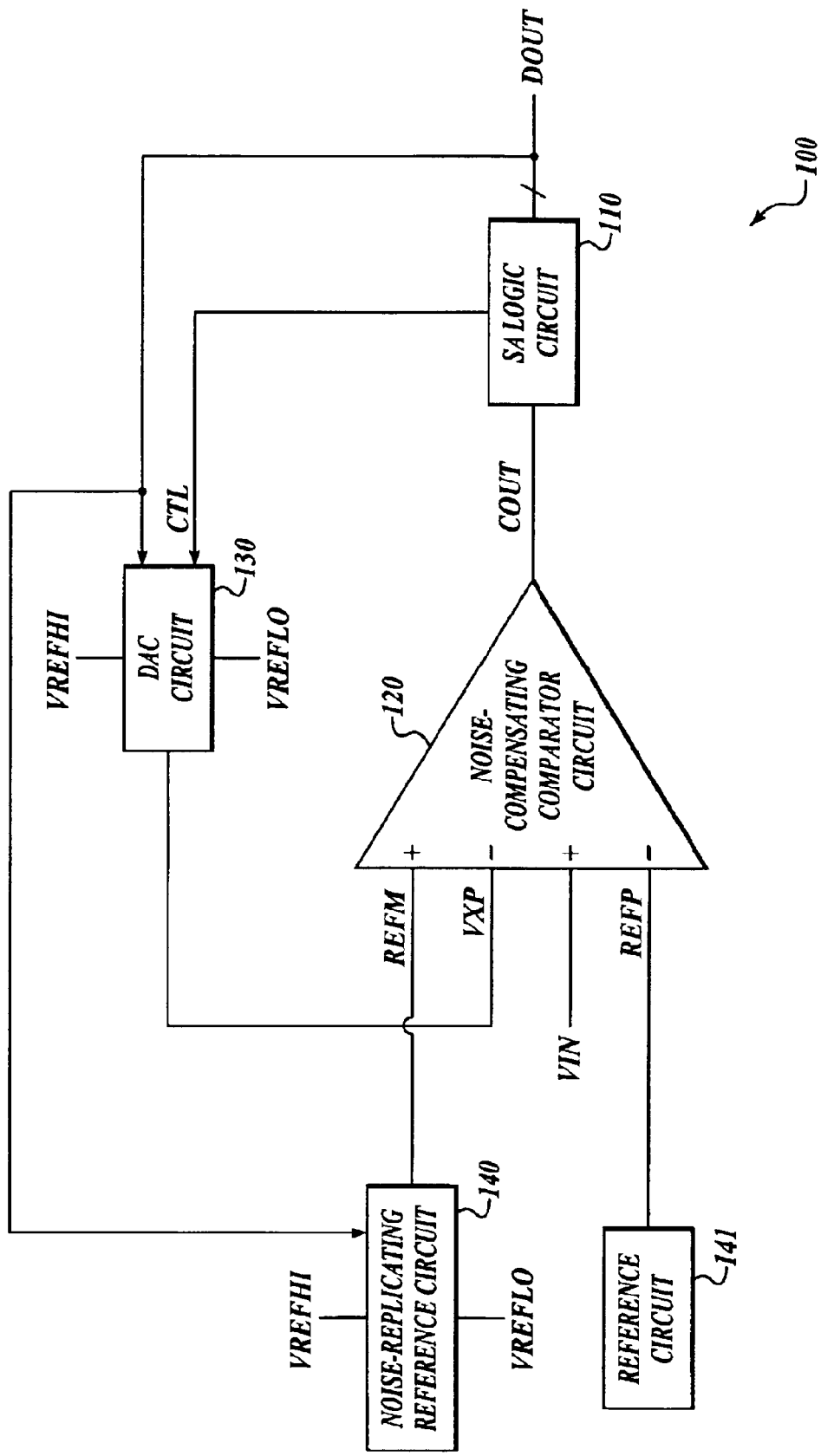
FIG. 1 illustrates a block diagram of an embodiment of a successive approximation (SA) analog-to-digital converter (ADC) circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The term "connected" means a direct electrical connection between the items connected, without any intermediate devices. The phrase "in one embodiment," as used herein does not necessarily refer to the same embodiment, although it may. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to an apparatus and method for noise reduction in an SA ADC. In one embodiment, the SA ADC includes a noise-compensating comparator circuit, an SA logic circuit, a DAC circuit, and at least one noise-replicating reference circuit. The noise-replicating reference circuit generates a first reference signal including a noise component that is substantially similar to a noise component of a first comparison signal. The noise-compensated comparator circuit is configured to provide a differential signal. The first comparison signal is included in a first half of the differential signal, and the first reference signal is included in a second half of the differential signal, such that the noise component of the first comparison signal is substantially cancelled out differentially. The noise-compensating comparator circuit is further configured to compare the two halves of the differential signal to provide a comparator output signal. The SA logic circuit may generate a digital output signal from the comparator output signal. The DAC circuit may use the digital output signal to generate at least one of the first and second comparison signals.

FIG. 1 illustrates a block diagram of an embodiment of SA ADC circuit 100. SA ADC 100 may be configured to provide a digital output signal (DOUT) in response to an analog input signal (VIN). SA ADC circuit 100 may include SA logic circuit 110, noise-compensating comparator circuit 120, DAC circuit 130, noise-replicating reference circuit 140, and reference circuit 141.

SA logic circuit 110 may be configured to provide signal DOUT and control signal CTL. SA logic circuit 110 may be configured to initially provide signal DOUT such that the most significant bit of signal DOUT corresponds to one and the remaining bits of signal DOUT corresponds to zero. DAC circuit 130 may be configured to convert digital output signal DOUT into an analog voltage signal (Vxp). Noise-compensating comparator circuit 120 may be configured to perform a noise-compensated comparison of signal Vxp and signal VIN, and to provide a comparator output signal (COUT) in response to the noise-compensated comparison. If signal COUT corresponds to logic one, thus indicating that signal VIN is less than signal Vxp, then SA logic circuit 110 may be configured to change the most significant bit of signal DOUT to zero. Alternatively, if signal COUT corresponds to logic zero, thus indicating than signal VIN is greater than signal Vxp, then SA logic circuit 110 may be configured to leave signal DOUT at one.

SA logic circuit 110 may be further configured to then convert the next most significant bit of signal DOUT and to perform substantially similar actions as previously described, and either leave the second most significant bit at one or changing it to zero depending on the comparator output signal. Next, SA logic circuit may be further configured to then continue perform substantially similar actions on each bit in turn until each bit of signal DOUT has been tested.

Reference circuit 141 may be configured to provide a reference signal (Refp) that includes a DC voltage component.

Noise-replicating reference circuit 140 may be configured to provide another reference signal (Refm), which includes a DC voltage component with a superimposed AC noise component. Additionally, this noise component may be substantially similar to a noise component of signal Vxp. Accordingly, when comparator circuit 120 combines signal Refm, signal Vxp, signal Refp, and signal Vxm, the noise component of signal Refm may be substantially cancelled out, as explained in further detail below with regard to FIG. 4.

DAC circuit 130 and noise-replicating reference circuit 140 may each be configured to receive voltage reference signals VREFLO and VREFHI. In one embodiment, VREFLO corresponds to ground, and signal VREFHI corresponds to VDD. In other embodiments, signal VREFLO and VREFHI may correspond to other voltage reference levels.

Although not shown, the digital output signal DOUT may be latched until the successive approximation conversion is complete.

Figure 2:
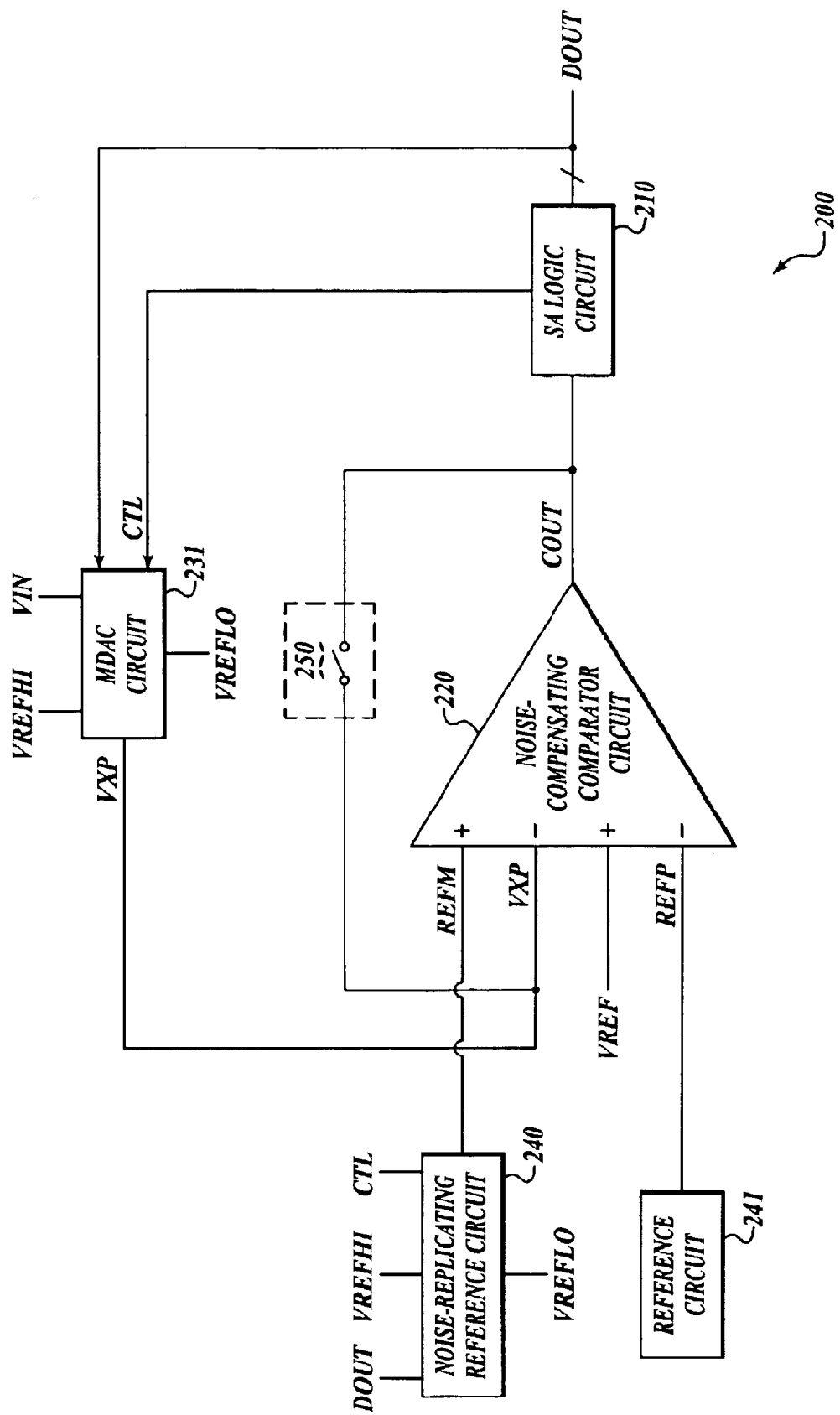
FIG. 2 shows a block diagram of another embodiment of an SA ADC circuit.

FIG. 2 shows a block diagram of an embodiment of SA ADC circuit 200. SA ADC circuit 200 may include SA logic circuit 210, noise-compensating comparator circuit 220, MDAC circuit 231, noise-replicating reference circuit 240, reference circuit 241, and switch circuit 250. Components in SA ADC 200 may operate in a substantially similar manner as similarly-named components in SA ADC 100, albeit in a different manner in some ways.

MDAC circuit 231 may be configured to sample analog input signal VIN during a sample phase. MDAC 231 may include a resistor ladder, a switched capacitor array, and the like.

Circuit 200 operates in alternating sample and hold phases. When in a sample phase, switch circuit 250 may be closed, and noise-compensating comparator circuit 220 may operate as an amplifier in closed loop operation.

During a hold phase, switch circuit 250 may be open, and MDAC circuit 231 may be configured to provide signal Vxp such that signal Vxp corresponds to signal VIN multiplied by a value that is associated with signal DOUT. Additionally, the timing of MDAC circuit 231 may be controlled by signal CTL.

Noise-compensating comparator circuit 220 may be configured to operate in a substantially similar manner as noise-compensating comparator circuit 120, albeit in a different manner in some ways. Noise-compensating comparator circuit 220 may be configured to provide a noise-compensated comparison of signal Vxp with reference voltage VREF. Reference voltage VREF may be a fixed reference voltage.

Figure 3:
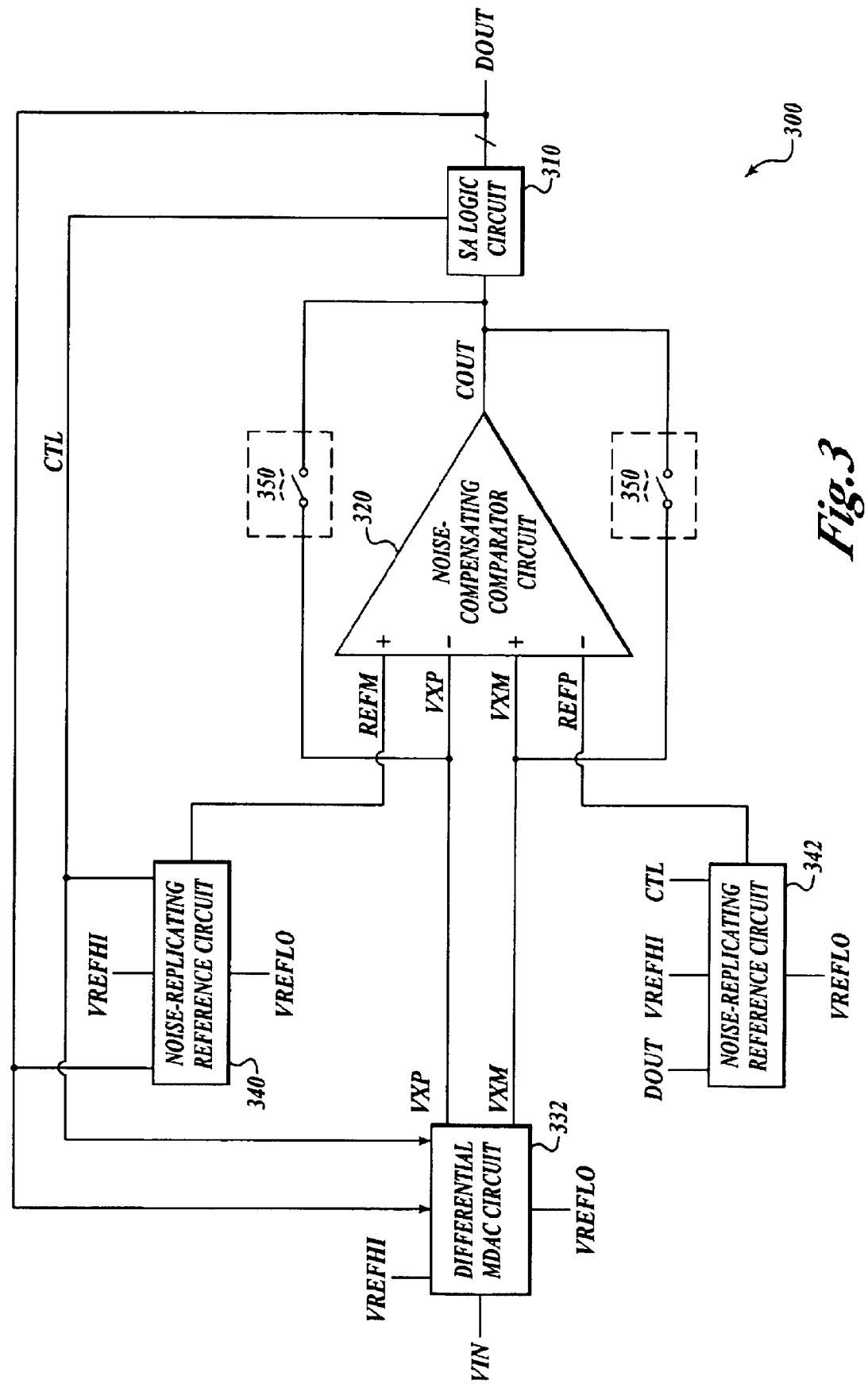
FIG. 3 illustrates a block diagram of yet another embodiment of an SA ADC circuit.

FIG. 3 illustrates a block diagram of an embodiment of SA ADC circuit 300. SA ADC circuit 300 may include SA logic circuit 310, noise-compensating comparator circuit 320, differential MDAC circuit 332, noise-replicating reference circuit 340, and noise-replicating reference circuit 342, and switches 350. Components in SA ADC 300 may operate in a substantially similar manner as similarly-named component in SA ADC 200, albeit in a different manner in some ways. Also, differential MDAC circuit 332 may include a resistor ladder, a switched capacitor array, and the like.

In circuit 300, signal VIN may be a differential signal.

Differential MDAC circuit 332 may be configured to provide a differential signal including signal Vxp and Vxm from signal VIN. A comparison value corresponding to a digital value associated with DOUT multiplied by VREFHI-VREFLO may be considered. Signals Vxp and Vxm may be provided such that signal Vxp is greater than signal Vxm, if signal VIN is greater than the comparison value. Signal Vxp and Vxm may be provided such that signal Vxp is less than signal Vxm, if signal VIN is less than the comparison value.

Signal Vxm may have a noise component, similarly to what was described regarding signal Vxp above.

Noise-replicating reference circuit 340 may be configured to provide signal Refm such that signal Refm includes a DC voltage component with a superimposed AC noise component. This noise component may be substantially similar to the AC noise component of signal Vxp. Additionally, noise-replicating reference circuit 342 may be configured to provide signal Refp such that signal Refp that includes a DC voltage component with a superimposed AC noise component. This noise component may be substantially similar to the AC noise component of signal Vxm. The DC component of signal Refm may be substantially similar to the DC component of signal Refp.

Noise-compensating comparator circuits 120, 220, 320 of FIGS. 1, 2, 3, respectively may be implemented in any number of ways. Two such ways are described below, with reference to FIG. 4 and FIG. 5.

Figure 4:
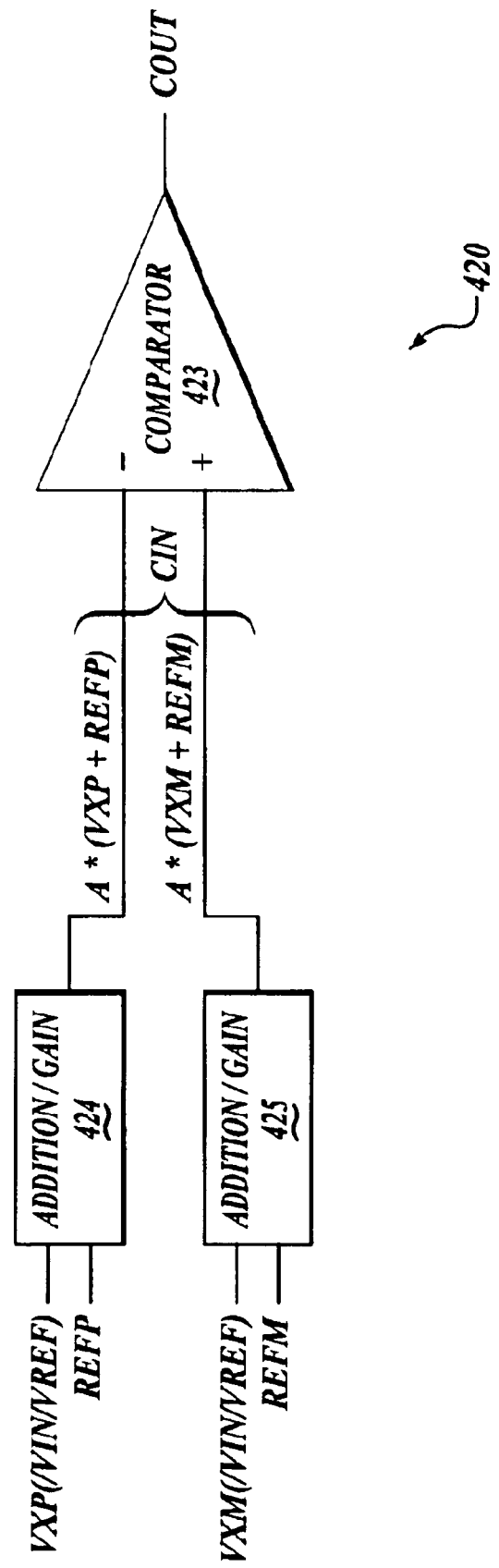
FIG. 4 shows a functional block diagram of an embodiment of the noise-compensating comparator circuit of FIGS. 1, 2, or 3.

FIG. 4 shows a functional block diagram of an embodiment of noise-compensating comparator circuit 420. Noise-compensating comparator circuit 420 may include addition/gain block 424, addition/gain block 425, and comparator 423.

Addition/gain block 424 may be configured to receive signal Refp and signal Vxp. Alternatively, depending on the particular embodiment of the SA ADC circuit being employed (e.g. DAC circuit 130, MDAC circuit 231, or differential MDAC circuit 332), signal Vxp may be replaced by signal VIN or signal VREF. In all these cases, however, the signal will be referred to as Vxp, it being understood that signal VIN or signal VREF may be substituted for signal Vxp in FIGS. 4–6. Similarly, depending on the embodiment of the SA ADC circuit being employed, signal Vxm may be replaced by signal VIN or signal VREF. The signal will be referred to as Vxm, it being understood that signal VIN or signal VREF may be substituted for signal Vxm in FIGS. 4–6. A difference, however, is that signals Vxp and Vxm may include noise components that are compensated for by signals Refm and Refp respectively. Such compensation need not take place if signals other than Vxp and Vxm are employed.

Addition/gain blocks 424 and 425 may be configured to provide a differential signal (CIN) that includes the output of addition/gain block 424 and the output of addition/block 425. In one embodiment, addition/gain block 424 is configured to add signal Refp to signal Vxp, and multiply the result by a gain factor (A). Although not shown, in another embodiment, addition/gain block 424 is configured to subtract signal Refm from signal Vxp, and multiply the result by the gain factor (A). In one embodiment, addition/gain block 425 is configured to add signal Refm to signal Vxm by the gain factor (A). Although not shown, in another embodiment, addition/gain block 425 is configured to subtract signal Refp from signal Vxm, and to multiply the result by a gain factor (A). In either case, comparator 423 may be configured to compare the outputs of addition/gain blocks 424 and 425 to provide comparator output signal COUT.

In one embodiment, the output of addition/gain block 424 includes signal Vxp, which includes a noise component, and the output of addition/gain block 425 includes signal Refm, which includes a substantially similar noise component. Therefore, the noise component of signal Vxp may be substantially cancelled out of signal CIN differentially. In other embodiments, the noise component of signal Vxp may be substantially cancelled out in some other manner. In either case, accuracy of signal COUT may be improved due to the noise cancellation.

Figure 5:
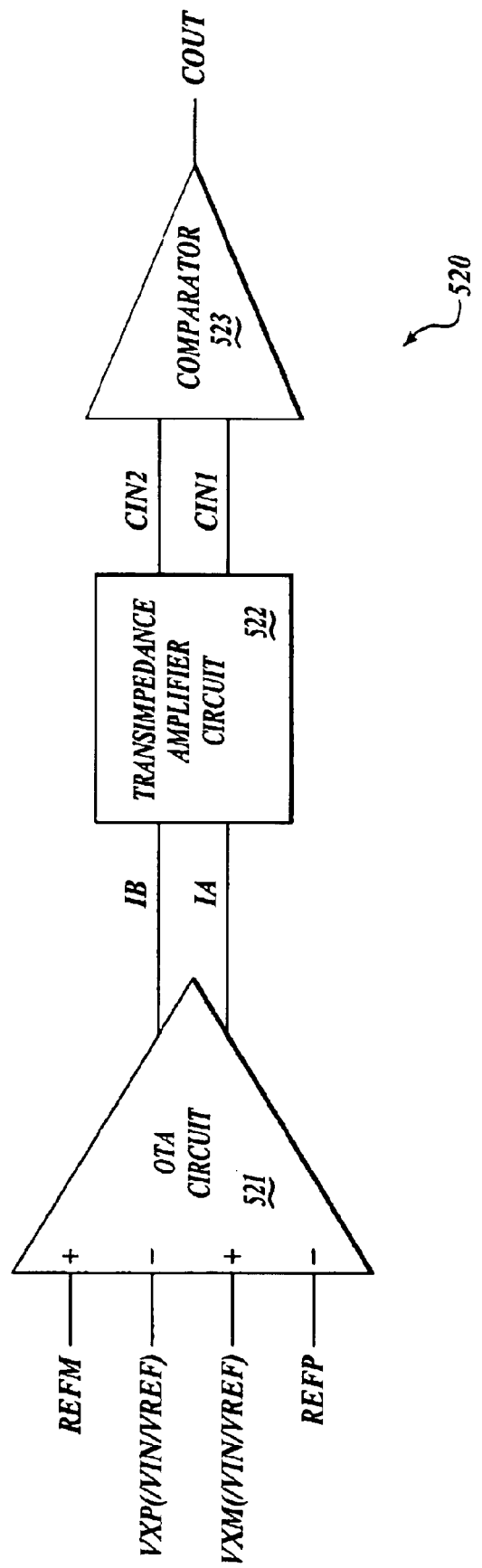
FIG. 5 illustrates a block diagram of another embodiment of the noise-compensating comparator circuit of FIGS. 1, 2, or 3.

FIG. 5 illustrates a block diagram of an embodiment of noise-compensating comparator circuit 520. Noise-compensating comparator circuit 520 may include OTA circuit 521, transimpedance amplifier circuit 522, and comparator 523.

OTA circuit 521 may be arranged to provide a differential current (IB–IA) from signals Refm, Vxp, Vxm, and Refp. Signals Vxp and Vxm may be replaced with other signals, such as described previously with regard to FIG. 4. Transimpedance amplifier circuit 522 may be configured to provide a differential voltage (CIN2–CIN1) in response to the differential current (IB–IA). According to one embodiment, transimpedance amplifier circuit 522 is a folded cascode amplifier. In other embodiments, transimpedance amplifier circuit 522 may include another type of circuit that provides transimpedance gain. In either case, comparator circuit 523 may be configured to provide signal COUT in response to signals CIN1 and CIN2.

Figure 6:
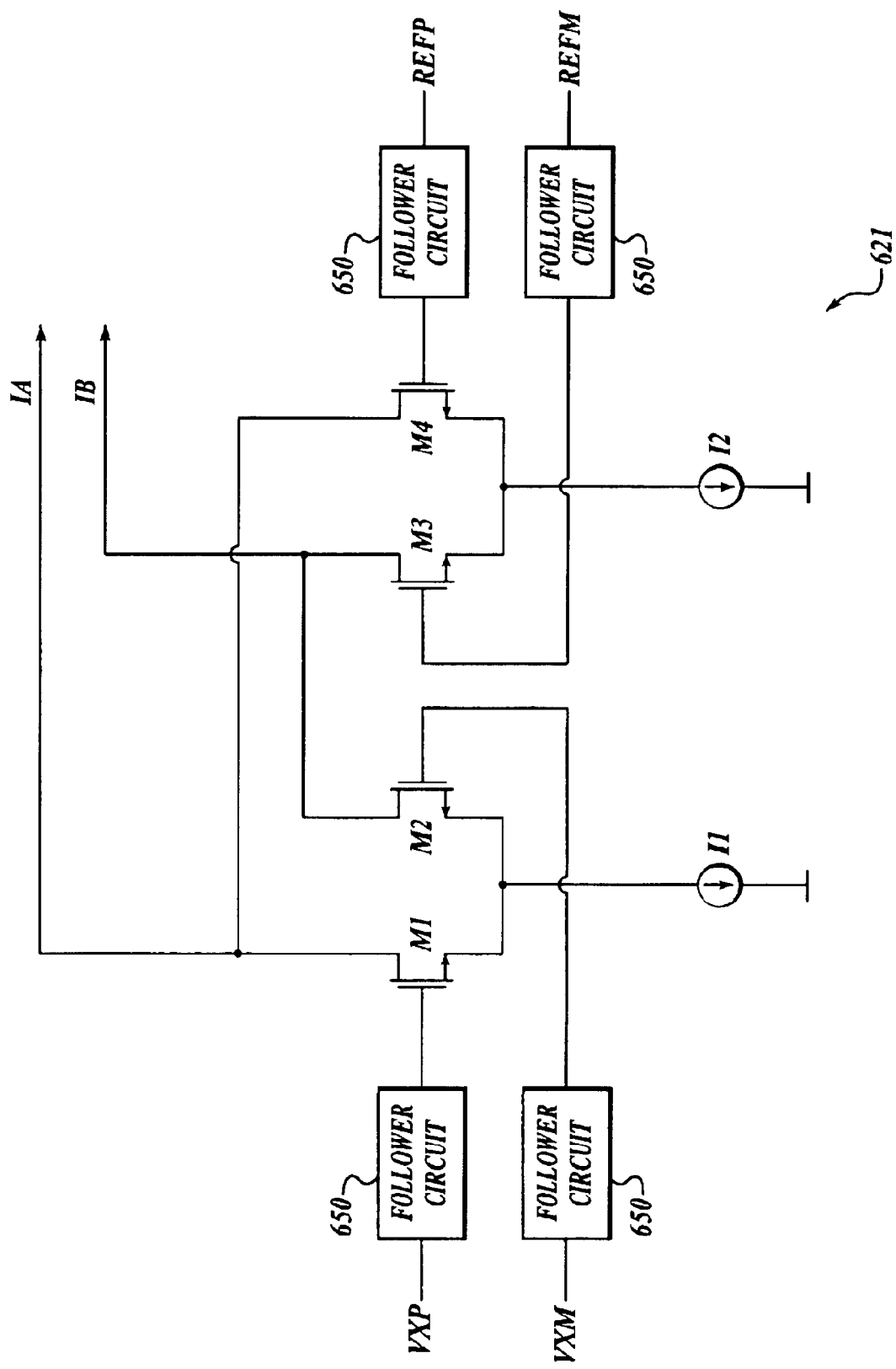
FIG. 6 shows an embodiment of the output transconductance amplifier (OTA) circuit of FIG. 5.

FIG. 6 shows an embodiment of OTA 621. OTA 621 is an embodiment of OTA 521. OTA 621 may include transistors M1–M4, tail current sources I1 and I2, and follower circuits 650. Signals Vxp and Vxm may be replaced with other signals, as described previously with regard to FIG. 4.

Each of the follower circuits 650 may be arranged to operate as a follower. Each of the follower circuits may be configured to operate as a buffer providing an output signal. This output signal includes an associated voltage that is substantially similar to the voltage associated with the input signal of follower circuit 650. According to one embodiment, each follower circuit 650 is a source follower. Transistors M1 and M2 may be arranged to operate as a first differential pair, and transistors M3 and M4 may be arranged to operate as a second differential pair. Additionally, current source I1 may be arranged to operate as a tail current source for the first differential pair, and current source I2 may be arranged to operate as a tail current source for the second differential pair.

The drain of transistor M1 may be coupled to the drain of transistor M4, and the drain of transistor M2 may be coupled to the drain of transistor M3. Accordingly, voltages Vxp and Refp may be combined (via addition and transimpedance) to provide signal IA, and voltages Vxm and Refm may be combined (via addition and transimpedance) to provide signal IB.

MDAC circuit 231 of FIG. 2 may be implemented in any number of ways. Two such ways are described below, with reference to FIG. 7 and FIG. 8.

Figure 7:
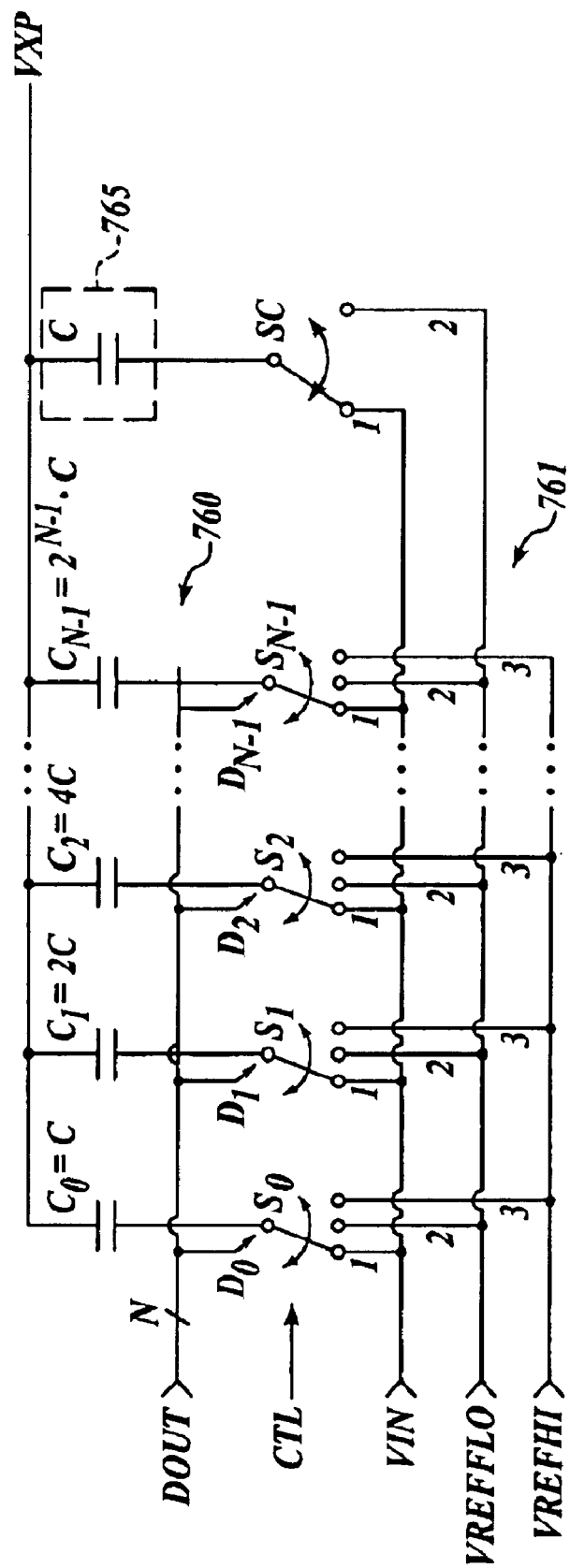
FIG. 7 schematically illustrates an embodiment of the multiplying DAC (MDAC) circuit of FIG. 2.

FIG. 7 schematically illustrates an embodiment of MDAC circuit 731. MDAC circuit 731 is one embodiment of MDAC 231, arranged for operation in circuit in one embodiment of circuit 200. MDAC circuit 731 may include capacitor array 760, switch array 761, capacitor 765, and switch SC.

Capacitor array 760 may have N capacitors $C_0$–$C_{N-1}$, where N is the number of bits in signal DOUT. Each capacitor $C_i$ may have an associated capacitance of $2^{i-1}*C$, where C is a unit capacitance value. Each of the capacitors $C_1$–$C_{N-1}$ may be a composite capacitor including a number of unit capacitors in series. Capacitor 765 may have a capacitance corresponding to the unit capacitance value C.

Switch array 761 may include N switches $S_0$–$S_{N-1}$. Each of the switches $S_i$ in switch array 761 may be coupled in series with corresponding capacitor $C_i$ in capacitor array 760. Each of the switches $S_i$ may be coupled between the corresponding capacitor $C_i$ and a separate corresponding switch node. Similarly, switch SC may be coupled between capacitor 765 and another separate corresponding switch node. Further, switch SC and each of the switches in switch array 761 may be responsive to control signal CTL such that the corresponding switch node becomes coupled to input signal VIN during the sample phase. Moreover, each switch $S_i$ of switch array 761 may be responsive to corresponding bit $b_i$ of signal DOUT during the hold phase. Switch SC may be responsive to signal CTL such that the switch node of switch SC becomes coupled to signal VREFLO during the hold phase.

Referring also to FIG. 2, and as stated above, during the sample phase switch 250 may be closed. Accordingly, a feedback operation of noise-compensating comparator circuit 220 may cause voltage Vxp to become substantially the same as the voltage of signal VREF. Accordingly, during the sampling phase, capacitors $C_0$–$C_{N-1}$ and capacitor 765 may be driven by VIN-VREF.

During the hold phase, the corresponding switch node of each switch $S_i$ in switch array 761 may be coupled to signal VREFLO or VREFHI, depending on a value of bit $b_i$. Therefore, capacitor array 760 may be coupled to a binary weighted version of signal VREFHI.

Accordingly, MDAC circuit 731 may be configured to sample signal VIN during the sample phase, and to provide signal Vxp such that signal Vxp corresponds to signal VIN multiplied by a digital value corresponding to signal DOUT during the hold phase.

Figure 8:
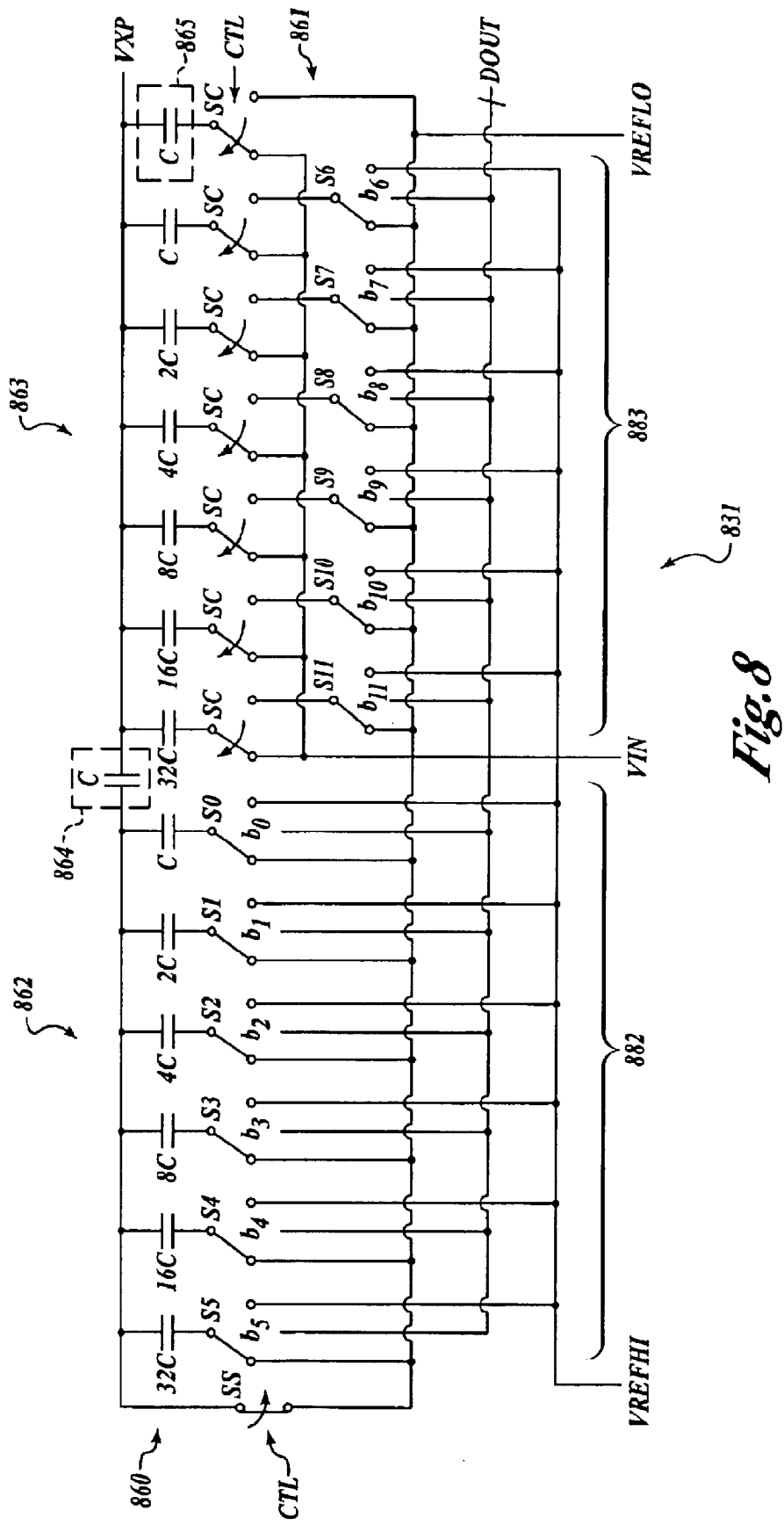
FIG. 8 schematically illustrates another embodiment of the MDAC circuit of FIG. 2.

FIG. 8 schematically illustrates an embodiment of MDAC circuit 831. MDAC circuit 831 is another embodiment of MDAC circuit 231, arranged for operation in one embodiment of circuit 200. MDAC circuit 831 may include capacitor group 860 and switch array 861. Components in MDAC circuit 831 may operate in a substantially similar manner as similarly-named component in MDAC circuit 731, albeit in a different manner in some ways. Capacitor group 860 may include capacitor array 862, capacitor array 863, capacitor 865, and coupling capacitor 864, which may couple capacitor array 862 to capacitor array 863. Switch array 861 may include switches $S_0$–$S_{11}$, switches SC, and switch SS.

The above structure may be viewed as divided into two banks. MSB bank 883 may include switches S11–S6, capacitor array 862, and switches SC. LSB bank 882 may include switches S5–S0, capacitor array 863, and switch SS.

An embodiment of MDAC circuit 831 is illustrated in which signal DOUT has 12 bits, $b_0$–$b_{11}$. However, it is understood that virtually any number of bits may be used for signal DOUT without departing from the spirit and scope of the invention. Also, the embodiment illustrated and described herein includes switches S11–S6 in MSB bank 883, associated with the six most significant bits of signal DOUT, and also includes switches S5–S0 in LSB bank 882, associated with the six least significant bits of signal DOUT. However, it is understood that NM most significant bits may be used with regard to MSB bank 883, and NL least significant bits may be used with regard to LSB bank 882, where NM and NL may be virtually any two positive integers such that NM+NL=N, wherein N is the number of bits in signal DOUT.

Switch SS may be configured to be closed during the sample phase, and be open during the hold phase. Accordingly, during the sample phase, the switch nodes of switches S0–S5 may each be coupled to signal VREFLO. The switch nodes of switches S11–S6 may each be coupled (via switches SC) to signal VIN during the sample phase. Accordingly, the capacitors in capacitor array 863 may be driven by VIN-VREF during the sample phase, and the capacitors in capacitor array 862 may be substantially shorted during the sample phase.

During the hold phase, MDAC circuit 831 may be configured to operate in a substantially similar manner as described with regard to MDAC circuit 731 during the hold phase.

Figure 9:
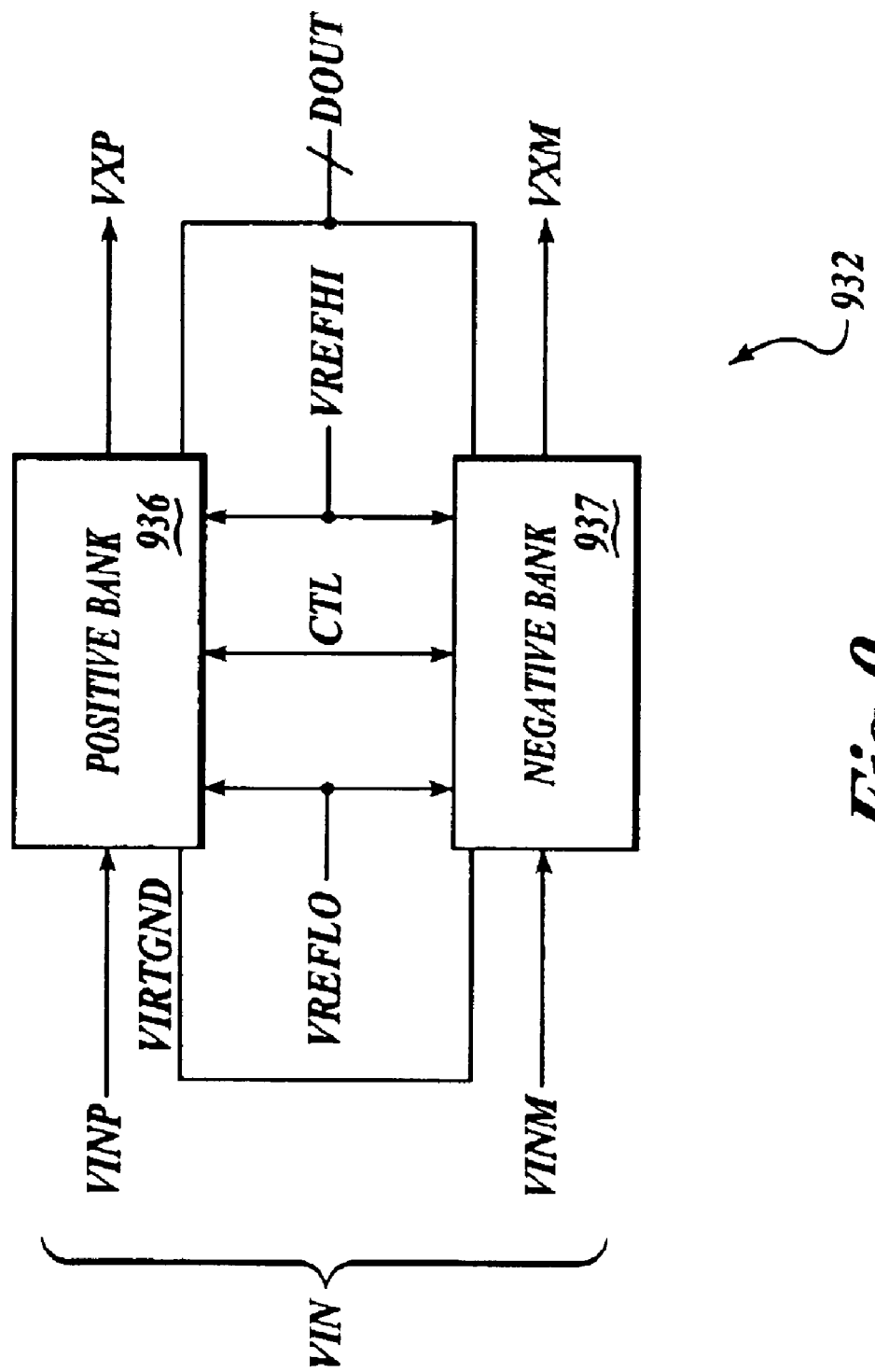
FIG. 9 shows a block diagram of an embodiment of the differential MDAC circuit of FIG. 3.

FIG. 9 shows a block diagram of an embodiment of differential MDAC circuit 932. Differential MDAC circuit 932 is an embodiment of differential MDAC circuit 332 arranged for operation in circuit 300. Differential MDAC circuit 932 may include positive bank 936 and negative bank 937.

In this embodiment, signal VIN is a differential signal that includes signals VINP and VINM. Positive bank 936 may be configured to provide signal Vxp from signal VINP and signal DOUT. Negative bank 937 may be configured to provide signal Vxm from signal VINM and signal OUT. Additionally, positive and negative banks 936 and 937 may be coupled together at a virtual ground node.

Figure 10:
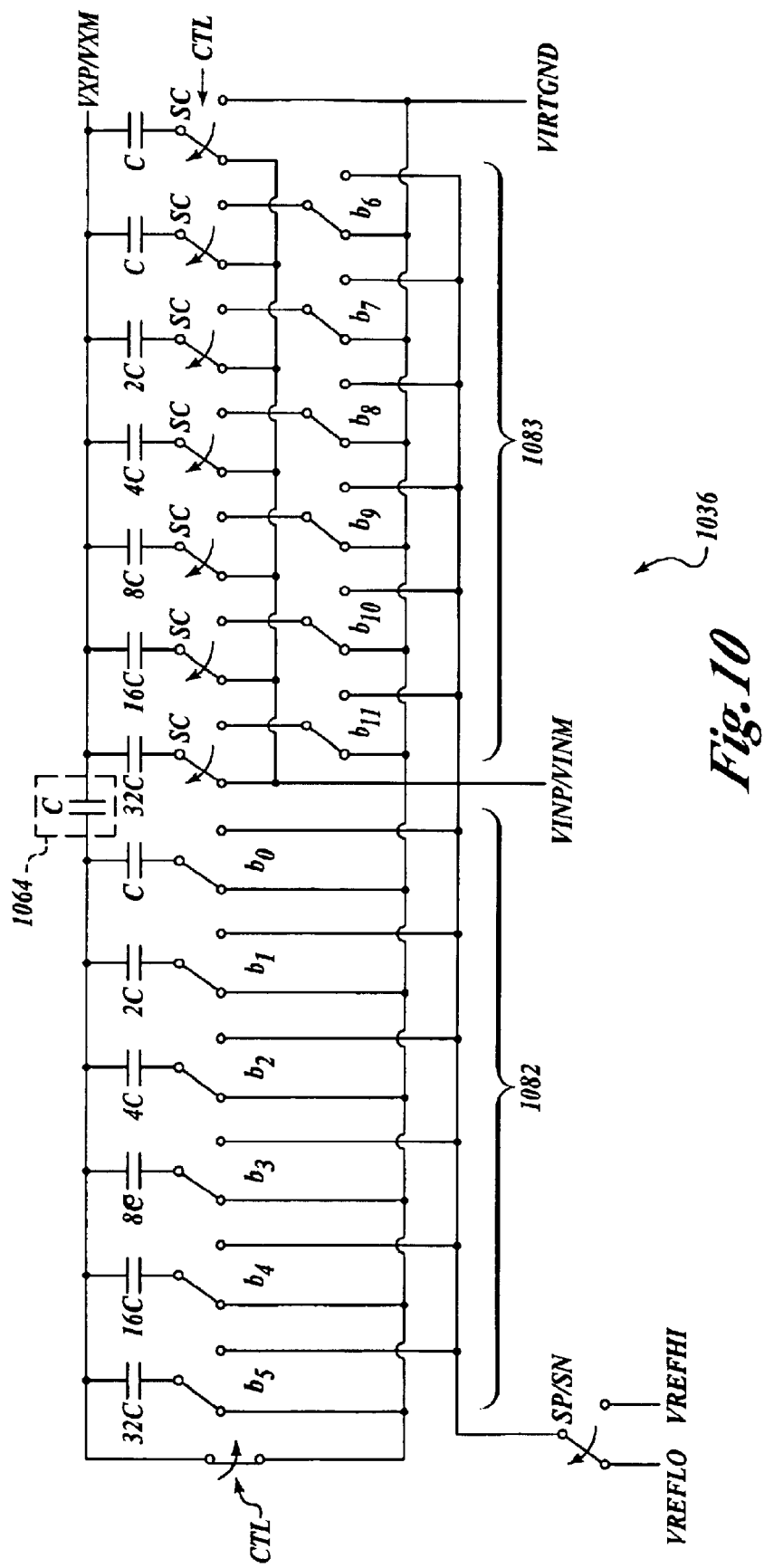
FIG. 10 schematically illustrates an embodiment of the positive and negative banks of FIG. 9.

FIG. 10 schematically illustrates an embodiment of positive bank 1036. Positive bank 1036 is an embodiment of positive bank 936 arranged for operation in differential MDAC circuit 932. Positive bank 1036 may have substantially similar architecture as MDAC circuit 831, albeit different in that positive bank 1036 further includes switch SP, and in other ways. Positive bank 1036 may include MSB bank 1083, LSB bank 1082, switch SC, and switch SP. Positive bank 1036 may be configured to operate in a substantially similar manner MDAC circuit 831, albeit different in some ways.

An embodiment of negative bank 937 is configured to operate in a substantially similar manner as positive bank 1036, albeit differently in that signal VINP is used in lieu of signal VINM, signal Vxp is used in lieu of signal Vxm, and switch SP is used in lieu of switch SN. Further, the switching of switch SN may be the opposite of the switching of switch SP.

Positive bank 1036 may operate in three phases: a sample phase, a hold phase, and a redistribution phase. During the sample phase, positive bank 1036 may operate in a substantially similar manner as described with respect to MDAC circuit 831, albeit different in that signal VINP is used in lieu of signal VIN, and signal VirtGnd is used in lieu of signal VREFLO.

During the hold phase, positive bank 1036 may operate in a substantially similar manner as described with respect to MDAC circuit 831, albeit different in some ways, including the presence of switch SP. During the hold phase, SA logic circuit 300 (referring to FIG. 3) may determine which one of Vxp or Vxm is greater. If Vxp is greater, then SA logic circuit 300 may cause switch SP to be coupled to signal VREFHI during the distribution phase, and an analogous switch SN in the negative bank to be coupled to signal VREFLO during the distribution phase. Conversely, if Vxm is greater, then SA logic circuit 300 may cause switch SP to be coupled to signal VREFLO during the distribution phase, and an analogous switch SN in the negative bank to be coupled to signal VREFHI during the distribution phase. During the distribution phase, positive bank 1036 may operate in a substantially similar manner as the hold phase, except for the switching of switch SP as discussed above.

Figure 11A:
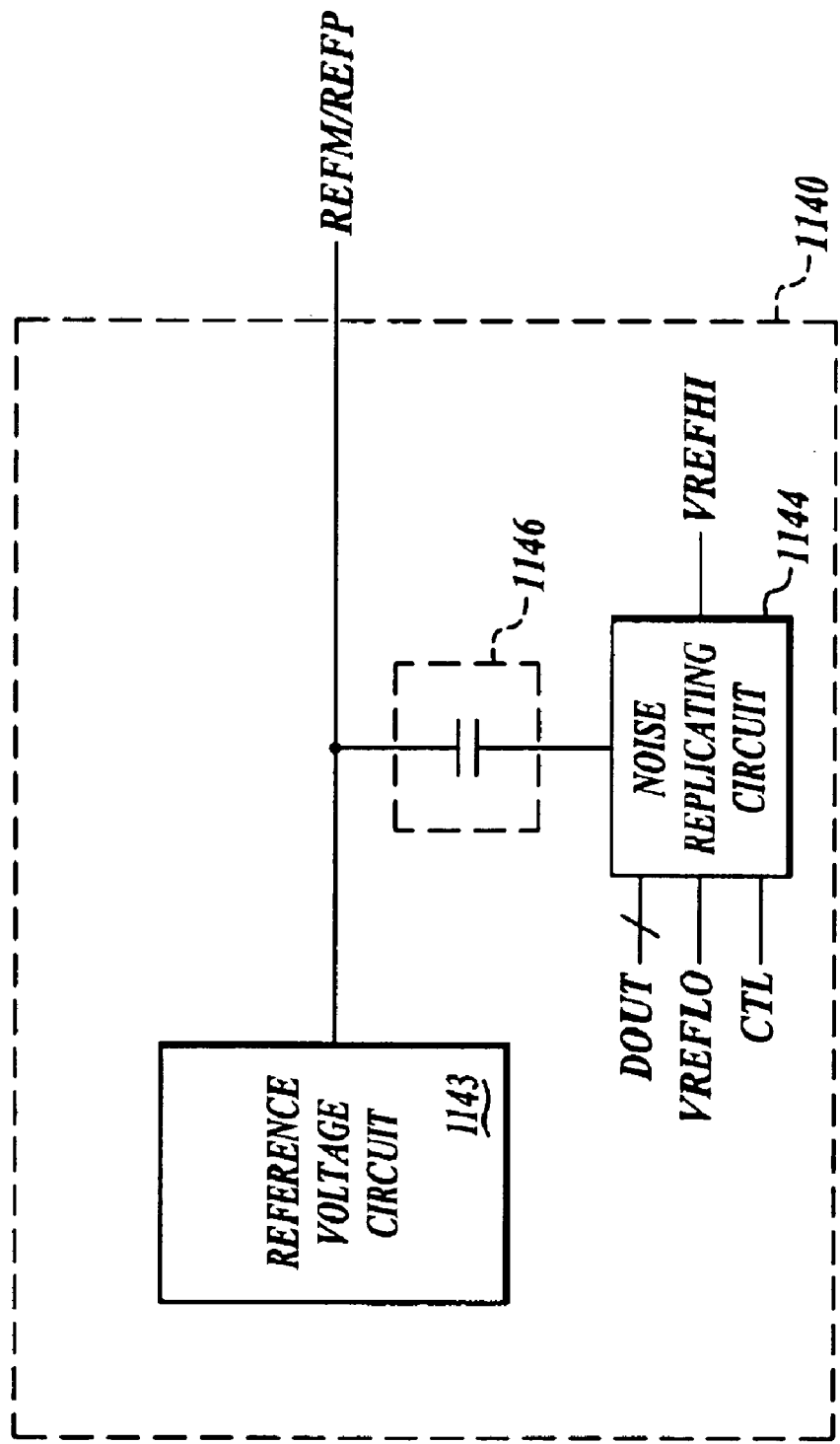
FIG. 11A shows a block diagram of an embodiment of a noise-replicating reference circuit of FIG. 1 or 2 that generates a DC level.

FIG. 11A shows a block diagram of an embodiment of noise-replicating reference circuit 1140. Noise-replicating reference circuit 1140 may include reference voltage circuit 1143, capacitor 1146, and noise replicating circuit 1144. Noise-replicating reference circuit 1140 may be configured to generate a signal Refm (or Refp) that includes a DC component, and an AC noise component that is superimposed on the DC component. Reference voltage circuit 1143 may be configured to provide the DC component of signal Refm. Noise replicating circuit 1144 and capacitive array 1146 may be configured to provide a noise signal that substantially replicates a noise of signal Vxp (or Vxm), and to capacitively couple the noise signal to the output of voltage reference voltage circuit 1143 to provide the noise component of signal Refm.

Figure 11B:
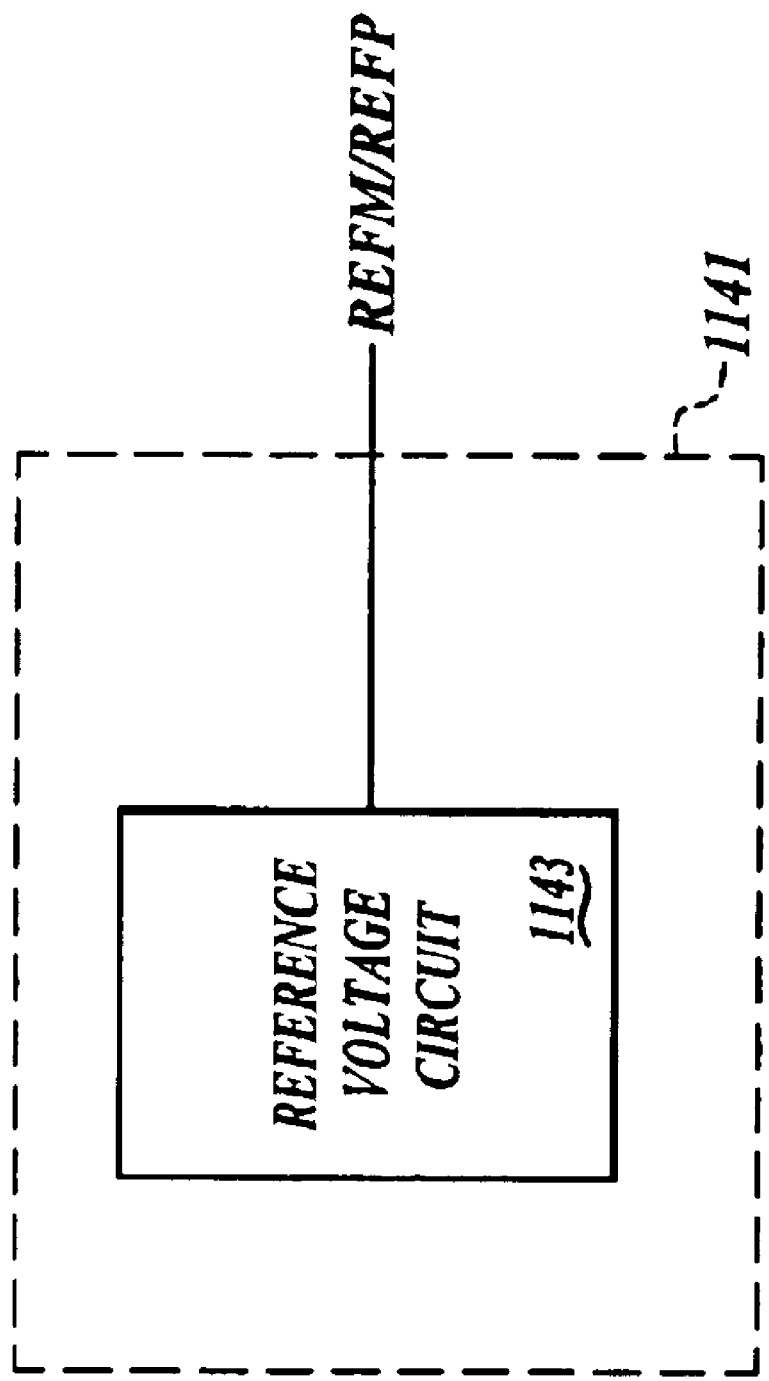
FIG. 11B shows a function block diagram of another embodiment of a reference circuit of FIGS. 1, 2, or 3 that generates compensating noise over a DC level.

FIG. 11B shows a function block diagram of an embodiment of reference circuit 1141. Reference circuit 1141 may include reference voltage circuit 1143. Reference voltage circuit 1143 may be configured to provide signal Refm such that signal Refm is a DC signal.

Figure 12:
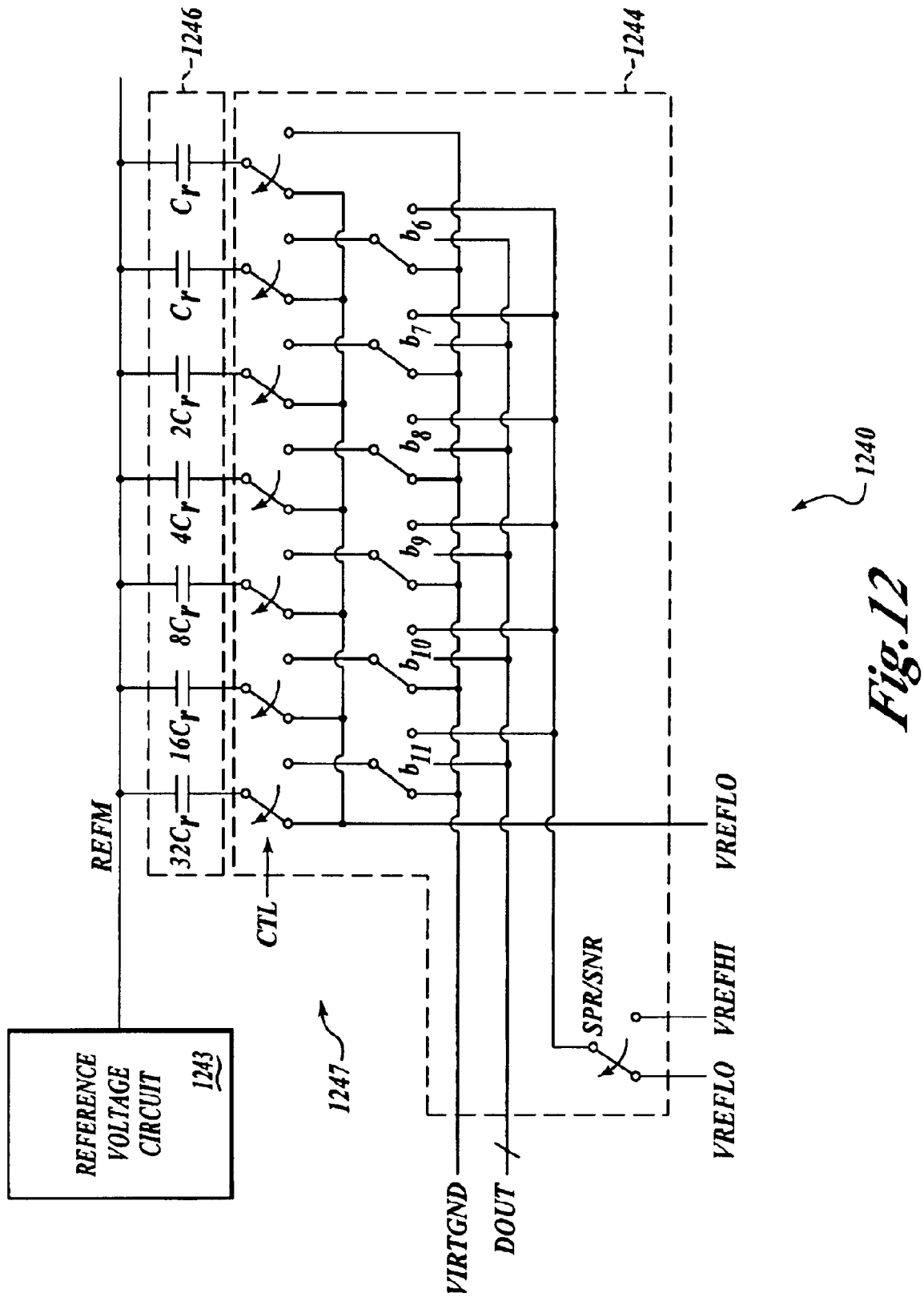
FIG. 12 illustrates an embodiment of a noise-replicating reference circuit of FIG. 3 that generates compensating noise over a DC level.

FIG. 12 illustrates an embodiment of noise-replicating reference circuit 1240, which may be a way of implementing circuit 1140. Noise-replicating reference circuit 1240 may include replicating array 1247 and reference voltage circuit 1243. Replicating array 1247 may include capacitor array 1246 and noise replicating circuit 1244. Noise replicating array 1244 may include switches. Noise replicating array 1244 may optionally include switch SPR, depending on whether the differential DAC circuit (e.g. 332) employs such a switch.

One embodiment of circuit 300 (of FIG. 3) includes an embodiment of differential MDAC 332 which includes a switched capacitor array (as described with reference to FIGS. 9 and 10 above). In this embodiment, noise replicating array 1244 in noise-replicating reference circuit 340 may be a substantial replica of MSB bank 1083 in both positive and negative banks 1036 (referring to FIG. 10). Further, in this embodiment, switching in noise replicating array 1244 may be substantially similar to the switching in MSB bank 1083. Noise replicating array 1244 in noise-replicating reference circuit 340 may include switch SPR, which may perform switching that is substantially similar to that of switch SP in positive bank 1036. Noise replicating array 1244 in noise-replicating reference circuit 341 may include switch SNR with switching that is substantially similar to that of switch SN in negative bank 1036. In another embodiment, noise replicating array 1247 may include a replica of MSB bank 1083 and LSB bank 1082.

An embodiment of noise-replicating reference circuit 1240 may be used as an embodiment of noise-replicating reference circuit 340 or noise-replicating reference circuit 341 (referring to FIG. 3) if differential MDAC circuit 332 is a resistor-based MDAC rather than a switched capacitor based MDAC. Similarly, an embodiment of noise-replicating reference circuit 1240 may also be employed as an embodiment for noise-replicating reference circuit 140 (referring to FIG. 1) or noise-replicating reference circuit 240 (referring to FIG. 2). In this embodiment, switch SPR need not be included. Also, switching control may be different than the embodiment previously discussed. An embodiment of the switching control that may be employed in the noise-replicating reference circuit if the DAC circuit (e.g. DAC circuit 130, MDAC circuit 231, or differential MDAC circuit 232) is resistor-based is described in greater detail with respect to FIG. 15 below.

Further, an embodiment of noise-replicating reference circuit 1240 may be used as an embodiment of noise-replicating reference circuit 240 or noise-replicating reference circuit 140 if a switched capacitor array embodiment (e.g. MDAC circuit 731 or MDAC circuit 831, referring to FIGS. 7 and 8) is used for the DAC circuit (e.g. DAC 130 or MDAC 231, referring to FIGS. 1 and 2). In this embodiment, switch SPN need not be employed. In this embodiment, noise replicating array 1247 may be a substantial replica of the MDAC circuit (e.g. MDAC circuit 731 or MDAC circuit 831, referring to FIGS. 7 and 8). In this embodiment, switching control of noise-replicating reference circuit 1240 may be substantially similar to the switching control of the DAC circuit (e.g. DAC 130 or MDAC circuit 230) in the SA ADC circuit (e.g. 100 or 200) (referring to FIGS. 1 and 2). It is understood that other permutations of the previously discussed embodiments, and the like, may be employed without departing from the spirit and scope of the invention.

Figure 13:
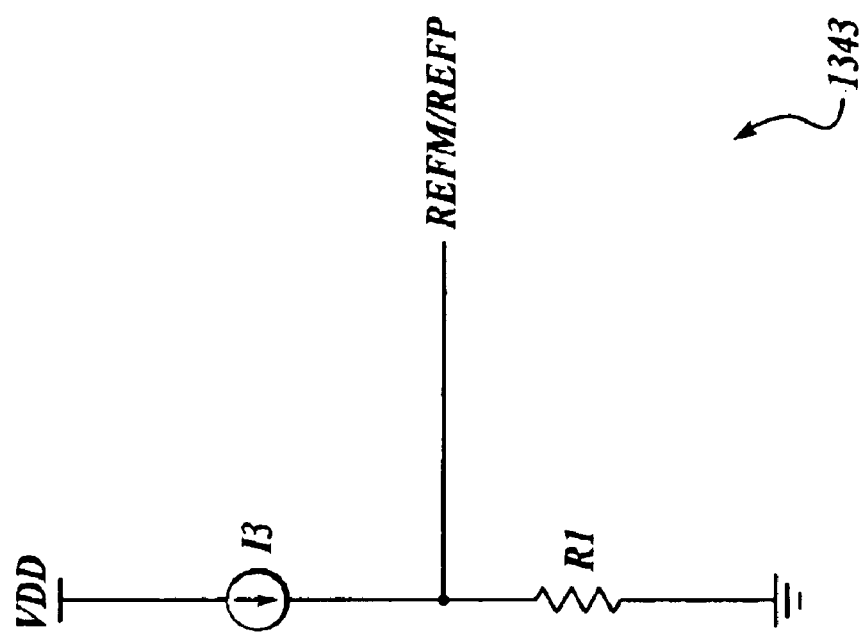
FIG. 13 shows an embodiment of a reference voltage circuit of FIG. 11 or FIG. 12.

FIG. 13 shows an embodiment of reference voltage circuit 1343. Reference voltage circuit 1343 may be configured to provide DC reference voltage Refm or Refp. An embodiment of noise-replicating reference circuit 1343 may be used as an embodiment of reference voltage circuit 1243 arranged for operation in noise-replicating reference circuit 1240, or as an embodiment of reference voltage circuit 1143 arranged for operation in noise-replicating reference circuit 1140 or reference circuit 1141. Reference voltage circuit 1343 may include current source I3 and resistor R1. Current source I3 may be configured to provide a current to resistor R1. Resistor R1 may be configured to provide signal Refm or Refp in response to the current.

Figure 14:
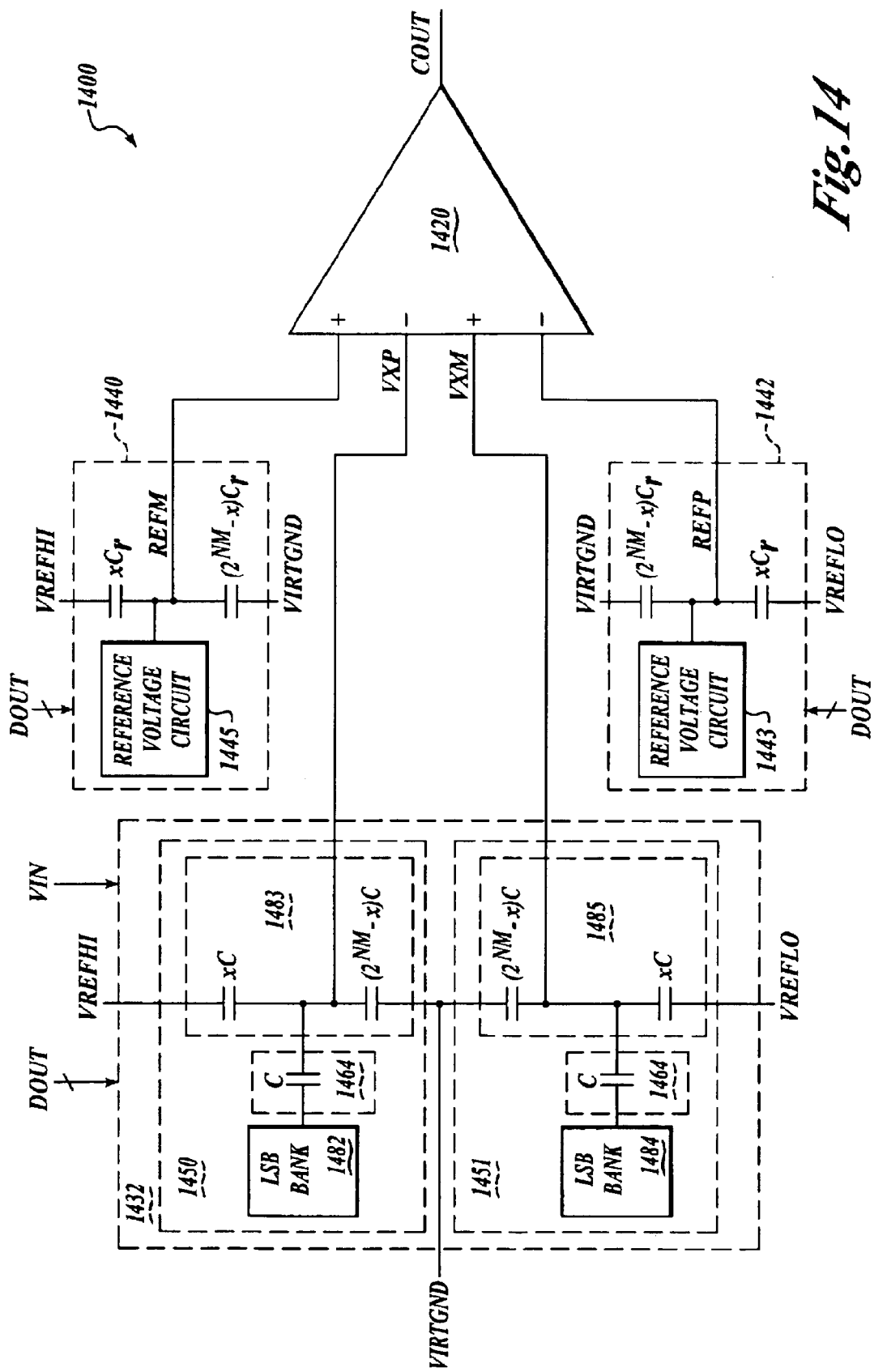
FIG. 14 illustrates an embodiment of a portion of the SA ADC of FIG. 3.

FIG. 14 illustrates an embodiment of portion 1400 of an SA ADC. Portion 1400 includes differential MDAC circuit 1432, noise-replicating reference circuit 1440, noise-replicating reference circuit 1442, and noise-compensating comparator circuit 1420. Components in portion 1400 may operate in a substantially similar manner as similarly-named component in SA ADC 300, albeit different in some ways.

Differential MDAC circuit 1432 may be a capacitor-based differential MDAC (e.g. MDAC 932). Differential MDAC circuit 1432 may include positive bank 1450 and negative bank 1451. Positive bank 1450 may include positive MSB bank 1483, coupling capacitor 1464, and positive LSB bank 1482. Similarly, negative bank 1451 may include negative MSB bank 1485, coupling capacitor 1464, and negative LSB bank 1484.

FIG. 14 illustrates positive MSB bank 1483, negative MSB bank 1485, and noise-replicating reference circuits 1440 and 1442 each with an equivalence circuit to illustrate the switching of the capacitors during an illustrative redistribution phase. As shown, x of the $2^{NM}$ unit capacitors (each having unit capacitance C) in positive MSB bank 1483 are switched such that they are coupled to VREFHI, and the other $2^{NM}-x$ of the unit capacitors in positive MSB bank 1483 are coupled to VirtGnd, where NM is the number of most significant bits of signal DOUT that are employed in noise-replicating circuits 1440 and 1442. Conversely, x of the $2^{NM}$ unit capacitors in negative MSB bank 1485 are switched such that they are coupled to VREFLO, and the other $2^{NM}-x$ of the unit capacitors in positive MSB bank 1483 are coupled to VirtGnd. The value of x is associated with the NM most significant bits of signal DOUT.

As discussed previously, noise-replicating reference circuits 1440 and 1442 may each have a substantially similar architecture as positive MSB bank 1483 and negative MSB bank 1485, respectively, albeit different in some ways. Also as discussed previously, switching of noise-replicating reference circuits 1440 and 1442 may be substantially similar to the switching of positive MSB bank 1483 and negative MSB bank 1485, respectively. As shown, x of the $2^{NM}$ unit capacitors (each having another unit capacitance $C_r$) in noise-replicating reference circuit 1440 are switched such that they are coupled to VREFHI, and the other $2^{NM}-x$ of the unit capacitors in noise-replicating reference circuit 1440 are coupled to VirtGnd. Conversely, x of the $2^{NM}$ unit capacitors in noise-replicating reference circuit 1442 are switched such that they are coupled to VREFLO, and the other $2^{NM}-x$ of the unit capacitors in reference circuit 1440 are coupled to VirtGnd.

Figure 15:
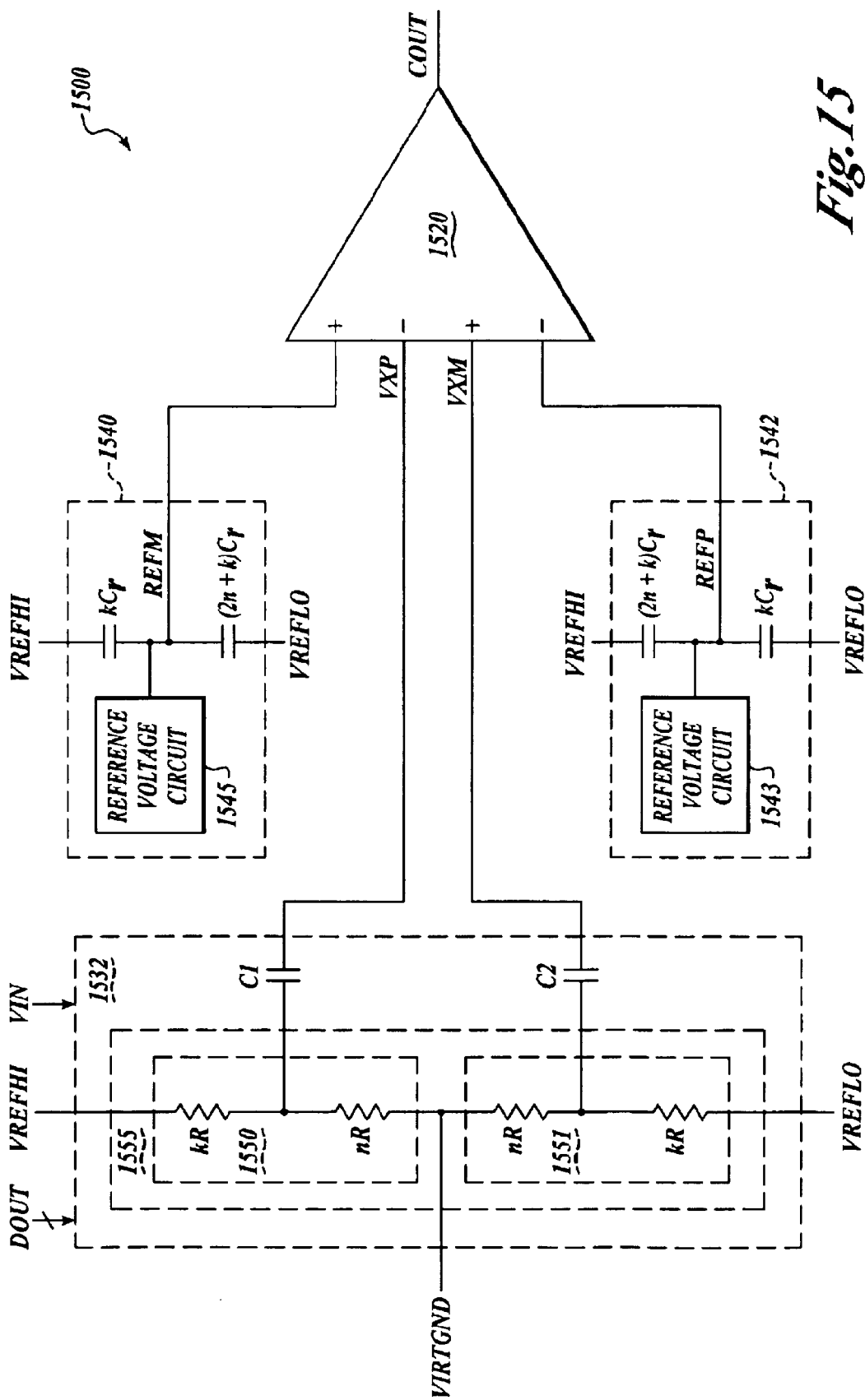
FIG. 15 illustrates another embodiment of the portion of the SA ADC of FIG. 3, arranged in accordance with aspects of the present invention.

FIG. 15 illustrates an embodiment of portion 1500 of an SA ADC. Portion 1500 includes differential MDAC circuit 1532, noise-replicating reference circuit 1540, noise-replicating reference circuit 1542, and noise-compensating comparator circuit 1520. Components in portion 1500 may operate in a substantially similar manner as similarly-named component in SA ADC 300, albeit different in some ways.

Differential MDAC circuit 1532 may be a resistor-based differential MDAC. Differential MDAC circuit 1532 may include resistor-based DAC 1555, capacitor C1, and capacitor C2. Resistor-based DAC 1555 may include positive bank 1550 and negative bank 1551. FIG. 15 illustrates positive bank 1550 and negative bank 1551 each with an equivalence circuit to illustrate that positive bank 1550 and negative bank 1551 each include a voltage divider with a resistance ratio of k:n and n:k respectively. The values of k and n may be controlled by signal DOUT. Positive bank 1550 and negative bank 1551 may be resistor ladders from which a particular voltage tap is selected by signal DOUT. Capacitors C1 and C2 may be configured to sample and hold signal VIN. Signal VIN may be a differential signal in portion 1500.

Noise-replicating reference circuits 1540 and 1542 may each have a substantially similar architecture as noise-replicating reference circuit 1240, albeit different in some ways. For example, the architecture may be different in that switch SPR need not be included in noise-replicating reference circuits 1540 and 1542. FIG. 15 illustrates the switched capacitors arrays of noise-replicating reference circuits 1540 and 1542 as equivalence circuits. Switching control may be employed in noise-replicating reference circuit 1540 such that the impedance ratio of the capacitors matches the resistance ratio of the voltage divider from VREFHI to VREFLO in DAC 1555 relative to the voltage tap selected for positive bank 1550. In this embodiment, the resistance ratio of the voltage divider from VREFHI to VREFLO relative to the voltage tap selected for positive bank 1550 is k:(2n+k). Accordingly, the capacitive array may be switched to provide a capacitance ratio of k:(2n+k) from VREFHI to VREFLO. By controlling the switches to provide an impedance ratio that is substantially similar to the resistance ratio, signal Refm may have a noise component that is substantially similar to a noise component of signal Vxp.

Similarly, switching control may be employed in noise-replicating reference circuit 1542 such that the impedance ratio of the capacitors is substantially similar to the resistance ratio of the voltage divider from VREFHI to VREFLO relative to the voltage tap selected for positive bank 1551. In this embodiment, the resistance ratio of the voltage divider from VREFHI to VREFLO relative to the voltage tap selected for negative bank 1551 is (2n+k):k. Accordingly, the capacitive array may be switched to provide a capacitance ratio of substantially (2n+k):k from VREFHI to VREFLO. By controlling the switches to provide an impedance ratio that is substantially similar to the resistance ratio, signal Refp may have a noise component that is substantially similar to a noise component of signal Vxm.

An embodiment of noise-replicating reference circuit 1540 may be used as an embodiment of noise-replicating reference circuit 150 or 240 if a resistor-based DAC circuit (e.g. DAC circuit 140 or MDAC circuit 240) is used in the SA ADC circuit (100 or 200) (referring to FIGS. 1 and 2). In this embodiment, the resistance ratio and the corresponding capacitor ratio may be k:n rather than k:(2n+k).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for successive approximation analog-to-digital conversion, comprising:
   a noise-compensating comparator circuit that is configured to provide a comparator output signal in response to a first comparison signal, a second comparison signal, a first reference signal, and a second reference signal,
   wherein the noise-compensating comparator circuit is configured to combine the first comparison signal, the second comparison signal, the first reference signal, and the second reference signal to provide a differential signal such that a noise component of the first comparison signal is substantially cancelled out;
   a successive approximation logic circuit that is configured to provide a digital output signal from the comparator output signal; and
   a digital-to-analog converter circuit that is configured to provide the first comparison signal from the digital output signal.

2. The circuit of claim 1, wherein the noise-compensating comparator circuit is configured to combine a signal derived from the first comparison signal with a signal derived from the second reference signal to provide a first half of the differential signal, and further configured to combine a signal derived from the second comparison signal with a signal derived from the first reference signal such that the noise component of the first comparison signal is substantially cancelled out differentially.

3. The circuit of claim 1, wherein the noise-compensating comparator circuit includes:
   a first differential pair, wherein the first differential pair includes a first transistor and a second transistor;
   a second differential pair, wherein the second differential pair having a third transistor and a fourth transistor, a drain of the third transistor is coupled to a drain of the second transistor, a drain of the fourth transistor is coupled to a drain of the first transistor, and wherein the first and second differential pairs are configured to provide a differential current; and
   a comparator that is configured to provide the comparator output signal from the differential current.

4. The circuit of claim 1, wherein the digital-to-analog converter circuit is a multiplying digital-to-analog converter circuit.

5. The circuit of claim 1, further comprising:
   a first reference circuit that is configured to provide the first reference signal such that the first reference signal includes a first DC component and a noise component superimposed on the first DC component, wherein the noise component of the first reference signal is substantially similar to the noise component of the first comparison signal; and
   a second reference circuit that is configured to provide the second reference signal such that the second reference signal includes a second DC component, wherein the second DC component is substantially similar to the first DC component.

6. The circuit of claim 5, wherein the first reference circuit includes:
   a current source circuit that is configured to provide a current; and
   a resistor that is configured to provide the first DC component in response to the current.

7. The circuit of claim 5, wherein the first reference circuit includes:
   a reference voltage circuit that is configured to provide the first DC component; and
   a replicating circuit that is configured to provide the noise component of the first reference signal.

8. The circuit of claim 7, wherein the replicating circuit includes a substantial replica of at least a portion of the digital-to-analog converter circuit.

9. The circuit of claim 7, wherein the replicating circuit includes:
   a plurality of capacitors; and
   a plurality of switches, wherein the plurality of switches are coupled to the plurality of capacitors.

10. The circuit of claim 9, wherein the digital-to-analog converter circuit includes a voltage divider configured to provide the first comparison signal according to a resistance ratio of the voltage divider, and
   wherein the successive approximation logic circuit is configured to control the switching of the plurality of capacitors such that an impedance ratio of the plurality of capacitors is substantially similar to the resistance ratio of the voltage divider.

11. The circuit of claim 9, wherein the plurality of capacitors is similar to capacitors of the digital-to-analog converter circuit, and wherein the plurality of switches is adapted to operate substantially similarly to how switches of the digital-to-analog converter circuit are adapted to operate.

12. The circuit of claim 11, wherein the switches of the digital-to-analog converter are configured to open and close responsive to a number of bits of the digital output signal.

13. A method for successive approximation analog-to-digital conversion, comprising:

combining a first comparison signal, a second comparison signal, a first reference signal, and a second reference signal to provide a differential signal;

comparing a first half and a second half of the differential signal to provide a comparison result signal;

employing successive approximation logic to provide a digital output signal from the comparison result signal; and employing digital-to-analog conversion to provide the first comparison signal from the digital output signal.

14. The method of claim 13, wherein combining includes:

providing a differential current such that a first half of the differential current corresponds to a sum of a current associated with a signal derived from the first comparison signal and a current associated with a signal derived from the second reference signal, and such that a second half of the differential current corresponds to a sum of a current associated with a signal derived from the second comparison signal and a current associated with a signal derived from the first reference signal, wherein the differential signal is derived from the differential current.

15. The method of claim 13, wherein the digital-to-analog conversion is a multiplying analog-to-digital conversion.

16. The method of claim 13, wherein combining is accomplished such that a noise component of the first comparison signal is substantially cancelled out.

17. The method of claim 13, further comprising:

generating the first reference signal such that the first reference signal includes a noise component that is substantially similar to a noise component of the first comparison signal.

18. The method of claim 17, wherein the first reference signal is generated such that the first reference signal further includes a DC reference component.

19. The method of claim 17, further comprising:

generating the second reference signal such that the second reference signal includes a DC reference level wherein the first reference signal is generated such that the first reference signal further includes a DC reference component that is substantially similar to the DC reference component.

20. A circuit for successive approximation analog-to-digital conversion, comprising:

means for combining a first comparison signal, a second comparison signal, a first reference signal, and a second reference signal to provide a differential signal;

means for comparing a first half and a second half of the differential signal to provide a comparison result signal;

means for employing successive approximation logic to provide a digital output signal from the comparison result signal; and means for employing digital-to-analog conversion to provide the first comparison signal from the digital output signal.

* * * * *

UNITED STATES PATENT AND TRADEMARK OFFICE
CERTIFICATE OF CORRECTION

PATENT NO. : 6,850,181 B1
DATED : February 1, 2005
INVENTOR(S) : Vadim Tsinker

It is certified that error appears in the above-identified patent and that said Letters Patent is hereby corrected as shown below:

Title page,
Item [74], *Attorney, Agent, or Firm*, delete "Mathew" and insert -- Matthew --.

Column 11,
Line 57, after "the" insert -- first --.

Column 12,
Line 6, after "from" delete "the".

Column 13,
Line 12, insert -- first -- before "second".

Signed and Sealed this

Nineteenth Day of July, 2005

JON W. DUDAS
*Director of the United States Patent and Trademark Office*